(12) United States Patent
Schnetzler et al.

(10) Patent No.: US 6,260,285 B1
(45) Date of Patent: Jul. 17, 2001

(54) PRECISION WORKPIECE POSITIONING DEVICE

(75) Inventors: Rene H. Schnetzler, Huntington; Stephen M. Kowalski, Levittown, both of NY (US)

(73) Assignee: NUTEC Components, Inc., Deer Park, NY (US)

( * ) Notice: Subject to any disclaimer, the term of this patent is extended or adjusted under 35 U.S.C. 154(b) by 0 days.

(21) Appl. No.: 09/378,893

(22) Filed: Aug. 23, 1999

Related U.S. Application Data

(60) Provisional application No. 60/097,573, filed on Aug. 24, 1998.

(51) Int. Cl.$^7$ ............................................. G01B 5/24
(52) U.S. Cl. ................................. 33/706; 33/702; 33/645
(58) Field of Search .............................. 33/503, 556, 613, 33/645, 702, 706, 707

(56) References Cited

U.S. PATENT DOCUMENTS

| | | | |
|---|---|---|---|
| 3,774,312 | * 11/1973 | Esch | 33/556 |
| 4,218,102 | 8/1980 | Moser . | |
| 4,505,464 | 3/1985 | Chitayat . | |
| 4,642,438 | 2/1987 | Beumer et al. . | |
| 4,663,852 | * 5/1987 | Guarini | 33/503 |
| 4,807,152 | * 2/1989 | Lane et al. | 33/503 |
| 5,276,974 | * 1/1994 | Chanoni et al. | 33/503 |
| 5,303,035 | 4/1994 | Luecke et al. . | |
| 5,461,237 | 10/1995 | Wakamoto et al. . | |
| 5,768,798 | * 6/1998 | Takahashi et al. | 33/556 |
| 6,058,618 | * 5/2000 | Hemmelgarn et al. | 33/503 |

* cited by examiner

*Primary Examiner*—G. Bradley Bennett
(74) *Attorney, Agent, or Firm*—Dilworth & Barrese, LLP

(57) ABSTRACT

A workpiece positioning device includes a frame; an elevator assembly mounted on the frame for motion along a z-axis; an inclined plane assembly attached to the elevator assembly; and a drive assembly mounted on the frame and configured to cause the elevator assembly to move along the z-axis, the drive assembly including a slide member and a bearing positioned in a first end portion of the slide member (which is formed in the shape of a wedge) to contact the inclined plane assembly. The drive assembly further includes a leadscrew for driving the slide member toward and away from the inclined plane assembly. The bearing is positioned in the first end portion of the slide member such that a portion of a circumference of the bearing protrudes from a surface of the first end portion of the slide member such that the bearing contacts the inclined plane assembly at a single point to cause the elevator assembly to move along a z-axis as the slide member is driven toward and away from the inclined plane assembly. The elevator assembly includes a platform for supporting a workpiece, and at least one set of guides positioned on either side of the elevator assembly for maintaining the elevator assembly in alignment with the z-axis. An encoder may be mounted adjacent to the elevator assembly for measuring a displacement of the elevator assembly along the z-axis. An angle formed between the inclined plane assembly and the frame is preferably 26 degrees, and the drive assembly, inclined plane assembly and elevator assembly are configured to cause displacement of a workpiece in increments of about ten nanometers.

20 Claims, 9 Drawing Sheets

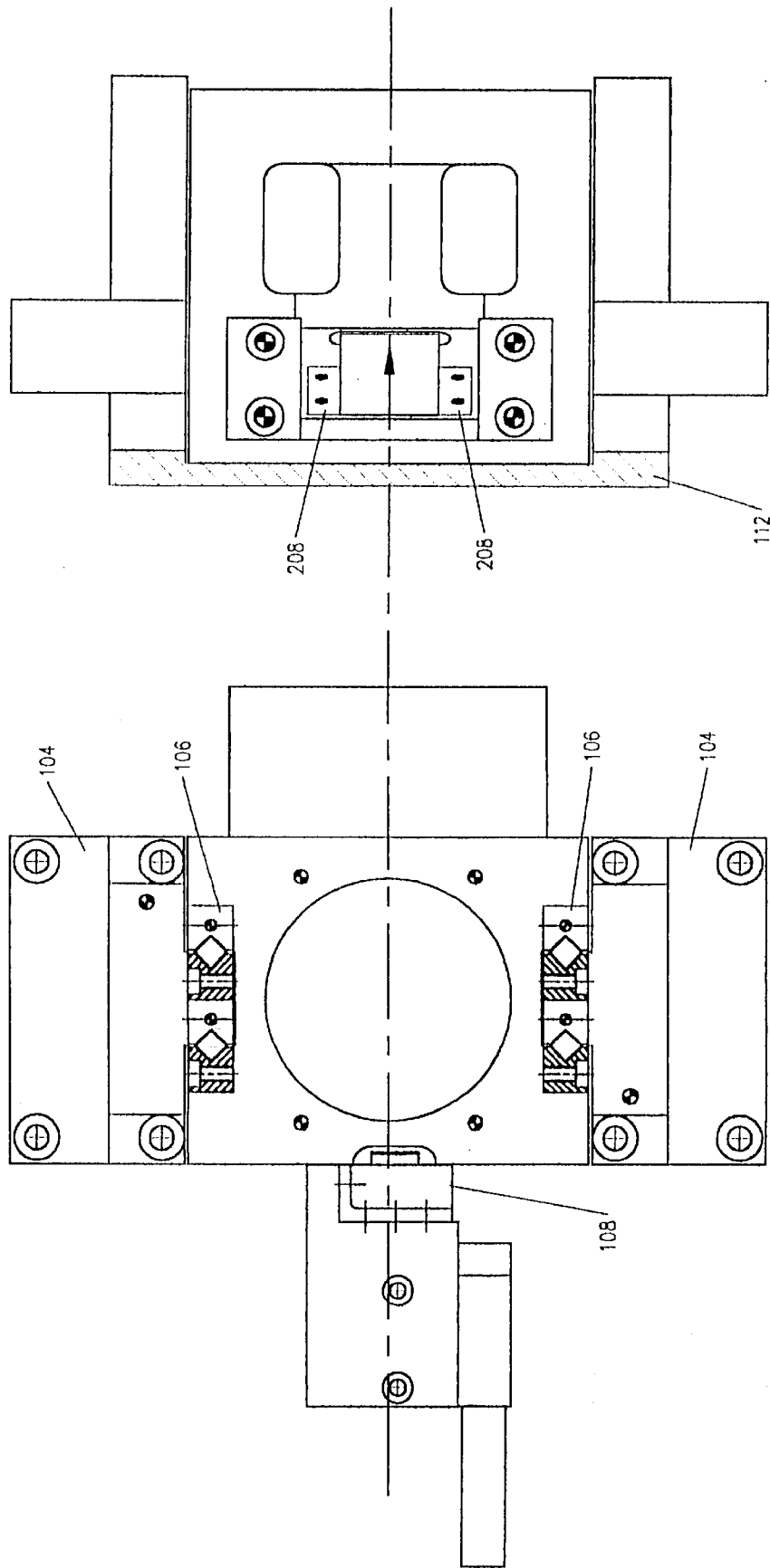

PRECISION WORKPIECE POSITIONING DEVICE

CROSS-REFERENCE TO RELATED APPLICATION

This application claims the benefit of U.S. Provisional Application No. 60/097,573, filed Aug. 24, 1998.

BACKGROUND OF THE INVENTION

1. Field of the Invention

The present invention relates to high precision workpiece positioning equipment and, more particularly, to equipment for precisely positioning workpieces in a vertical direction.

2. Description of the Related Art

There are many devices intended to provide physical placement of objects along and around multiple axes. However, with modem advances in technology, the need to precisely position workpieces, such as during manufacturing and testing procedures, has become more prevalent. For example, often, mechanical, optical, electronic, genetic, medical and chemical disciplines require exact placement of various components combined with an ability to manipulate the object in one or more dimensions. Possibly one of the more prominent needs is in the optical world of precision optics, lasers, lenses, and fiber optics. Other needs include micromachining and semiconductor device inspection.

Conventional methods include a series of adjustable leadscrews which are attached to a working platform or table at one end and some suitable base on the other. Each axis may then be manipulated by turning a micrometer type positioner a prescribed amount which, in turn, moves the working platform or table to the desired position relative to its base or some other reference such as an optical axis. However, these types of devices are inherently less precise than the precision required by today's technology.

Other conventional workpiece positioning devices are known to include two wedge-shaped members wherein a first wedge is driven by a leadscrew and is caused to engage the surface of a second wedge connected to the working platform. Thus, as the surfaces of the two wedges and the first wedge is driven forward and backward, the working platform is raised and lowered accordingly. However, conventional wedge-drive workpiece positioning devices exhibit limited ability to precisely position the workpiece, due to the tolerances in the angle, accumulation of manufacturing tolerances and smoothness of the contact surfaces of the opposing wedges.

Another problem with conventional wedge drive designs is a loss of accuracy associated with inadequate stability of the working platform as it is driven along the vertical axis, due, in large part, to the horizontal component of the force exerted by the wedge drive on an elevator component which supports and lifts the working platform. Conventional wedge drive positioning systems typically feature widely spaced cross roller guides which have a certain level of geometry error in the guide planes due to manufacturability. Since there are 3×2 surface planes involved, such widely spaced locating surfaces cannot be machined to the exceedingly close tolerances required to achieve the accuracies obtainable with the present invention. The design of the present invention reduces to 2 planes at close proximity.

What is clearly needed is a workpiece positioning device which overcomes the accuracy problems associated with prior art devices and is capable of positioning workpieces with a high degree of precision to meet the needs of present day technology.

SUMMARY OF THE INVENTION

It is an object of the present invention to provide a positioning device which is configured to permit positioning of workpieces in a vertical direction with higher precision than existing vertical positioning devices.

In one embodiment of the present invention a workpiece positioning device includes a frame; an elevator assembly mounted on the frame for motion along a z-axis; an inclined plane assembly attached to the elevator assembly; and a drive assembly mounted on the frame and configured to cause the elevator assembly to move along the z-axis, the drive assembly including a slide member and a bearing positioned in a first end portion of the slide member (which is formed in the shape of a wedge) to contact the inclined plane assembly. The drive assembly further includes a leadscrew for driving the slide member toward and away from the inclined plane assembly. The bearing is positioned in the first end portion of the slide member such that a portion of a circumference of the bearing protrudes from a surface of the first end portion of the slide member such that the bearing contacts the inclined plane assembly at a single point to cause the elevator assembly to move along a z-axis as the slide member is driven toward and away from the inclined plane assembly.

The elevator assembly includes a platform for supporting a workpiece, and at least one set of guides positioned on either side of the elevator assembly for maintaining the elevator assembly in alignment with the z-axis. An encoder may be mounted adjacent to the elevator assembly for measuring a displacement of the elevator assembly along the z-axis.

An angle formed between the inclined plane assembly and the frame is preferably 26 degrees, and the drive assembly, inclined plane assembly and elevator assembly are configured to cause displacement of a workpiece in increments of about ten nanometers.

A method of positioning a workpiece is also provided which includes the steps of mounting an elevator assembly on a frame; supporting a workpiece on a platform on the elevator assembly; attaching an inclined plane assembly to the elevator assembly; and driving a drive assembly toward and away from the elevator assembly to cause the elevator assembly to move a desired distance along a z-axis via a single point of contact between the drive assembly and the inclined plane assembly. The method of positioning a workpiece may further include the step of measuring the displacement of the elevator assembly along the z-axis via an encoder mounted on the elevator assembly. The driving step preferably includes driving the elevator assembly along the z-axis in increments of about ten nanometers.

These and other objects, features and advantages of the present invention will become apparent from the following detailed description of illustrative embodiments, which is to be read in connection with the accompanying drawings.

BRIEF DESCRIPTION OF THE DRAWINGS

For a better understanding of the invention, reference is made to the following description of exemplary embodiments thereof, and to the accompanying drawings, wherein:

FIG. 6 is a top view of the elevator assembly of FIG. 5;

FIG. 7 is a side view of the elevator assembly of FIG. 5;

DETAILED DESCRIPTION OF PREFERRED EMBODIMENTS

Figure 1:
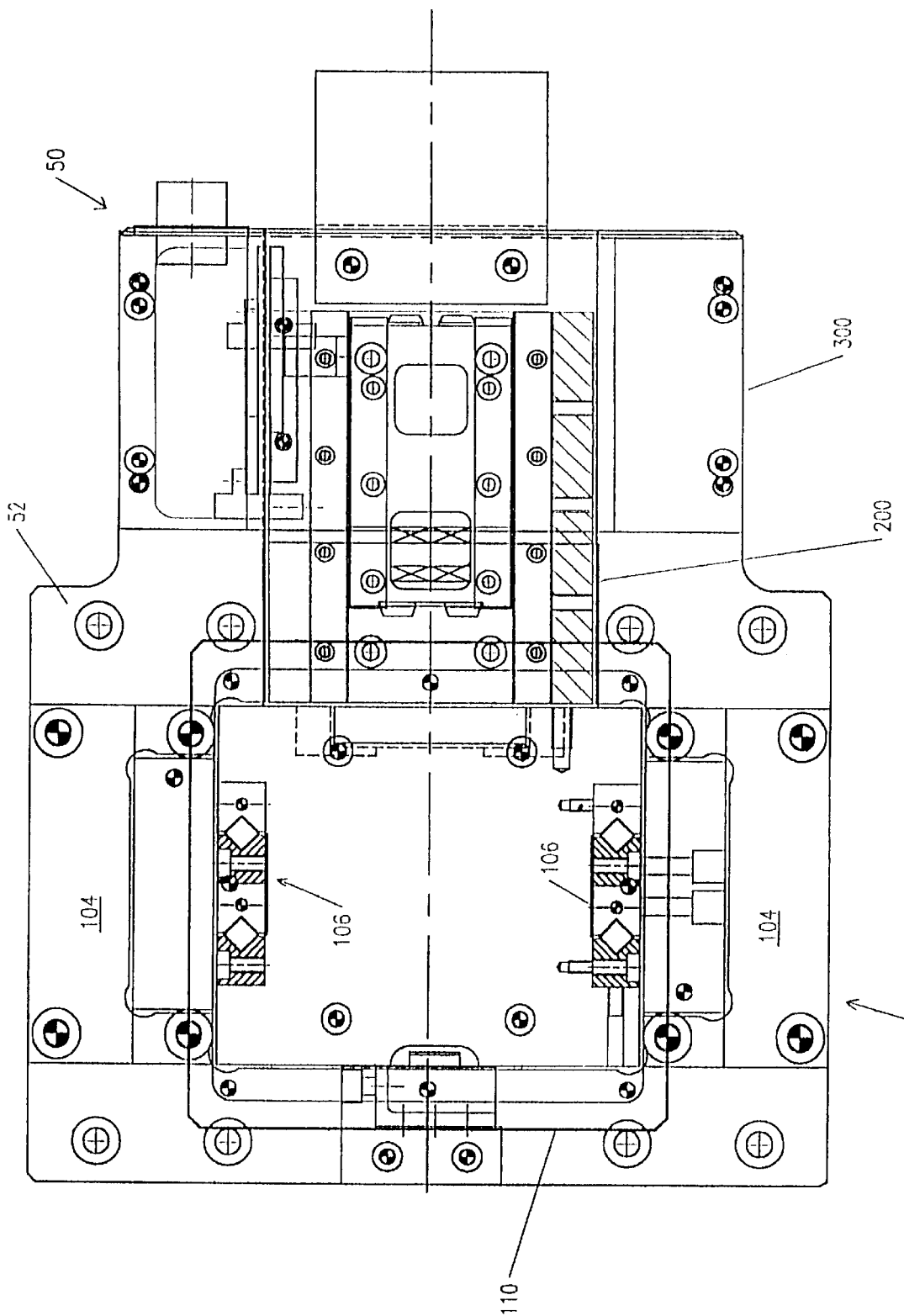
FIG. 1 is a top view of a fully assembled precision workpiece positioning device in accordance with the present invention.
Figure 2:
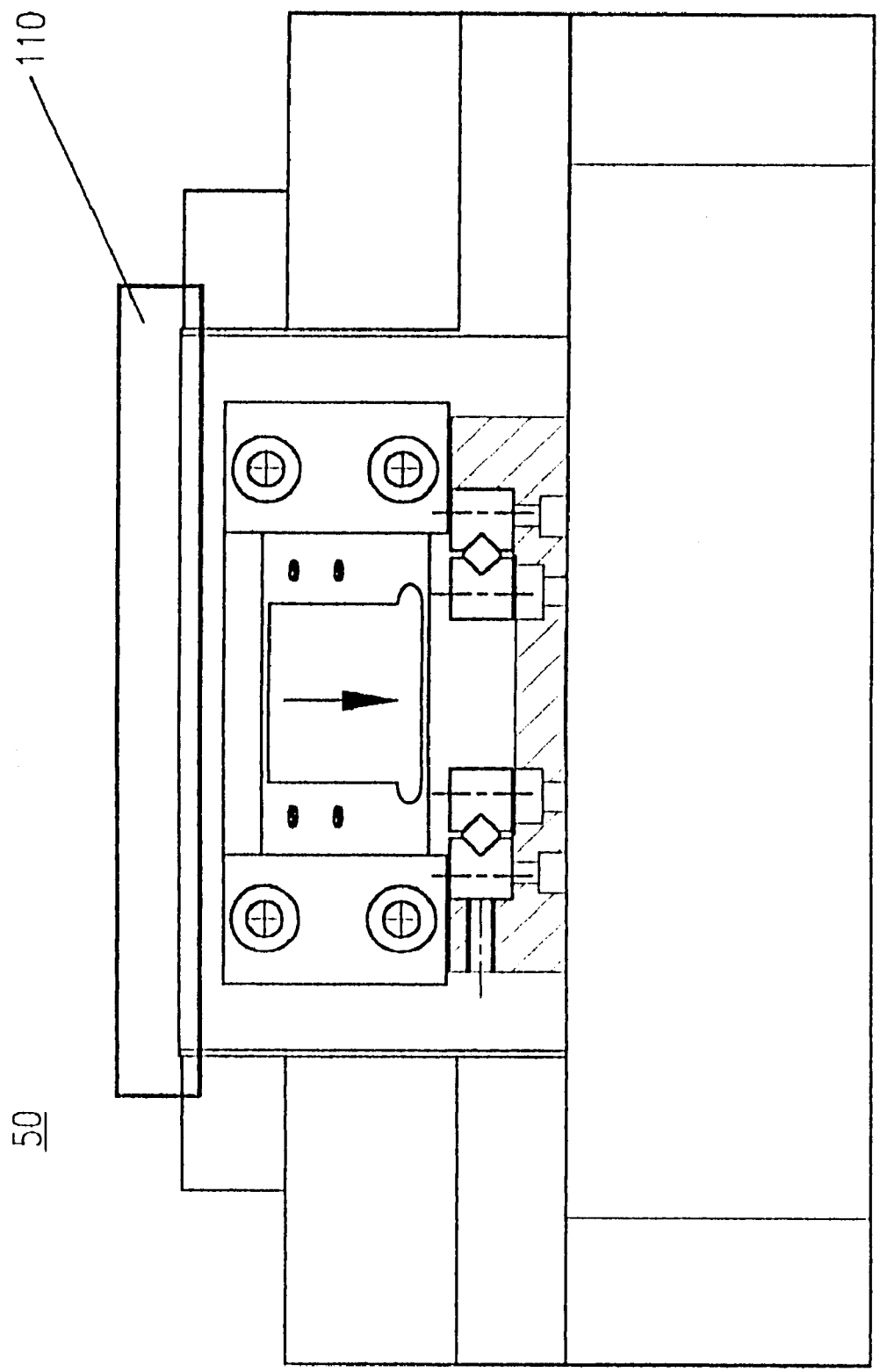
FIG. 2 is a first end view of the precision workpiece positioning device of FIG. 1.
Figure 3:
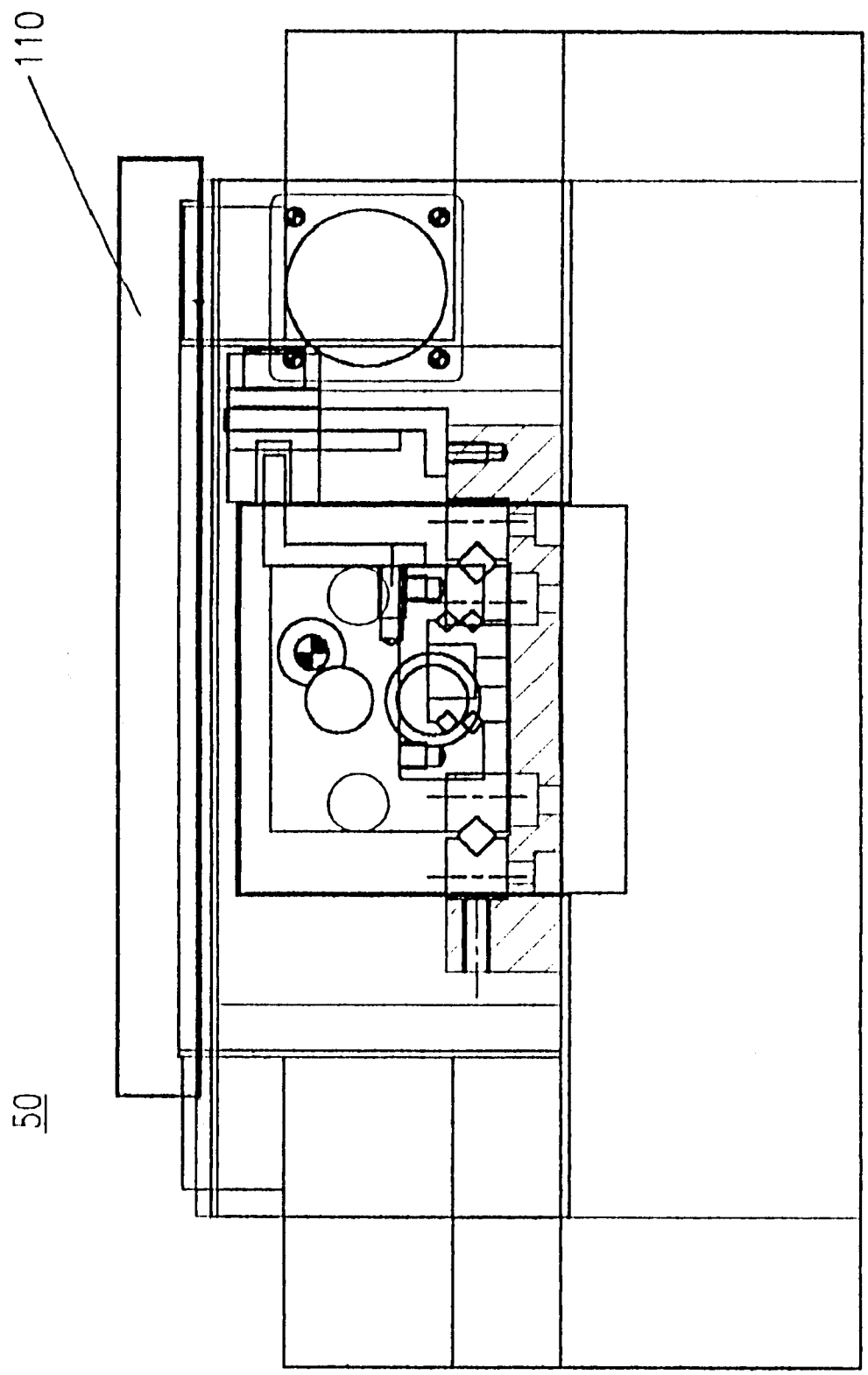
FIG. 3 is a second end view of the precision workpiece positioning device of FIG. 1.
Figure 4:
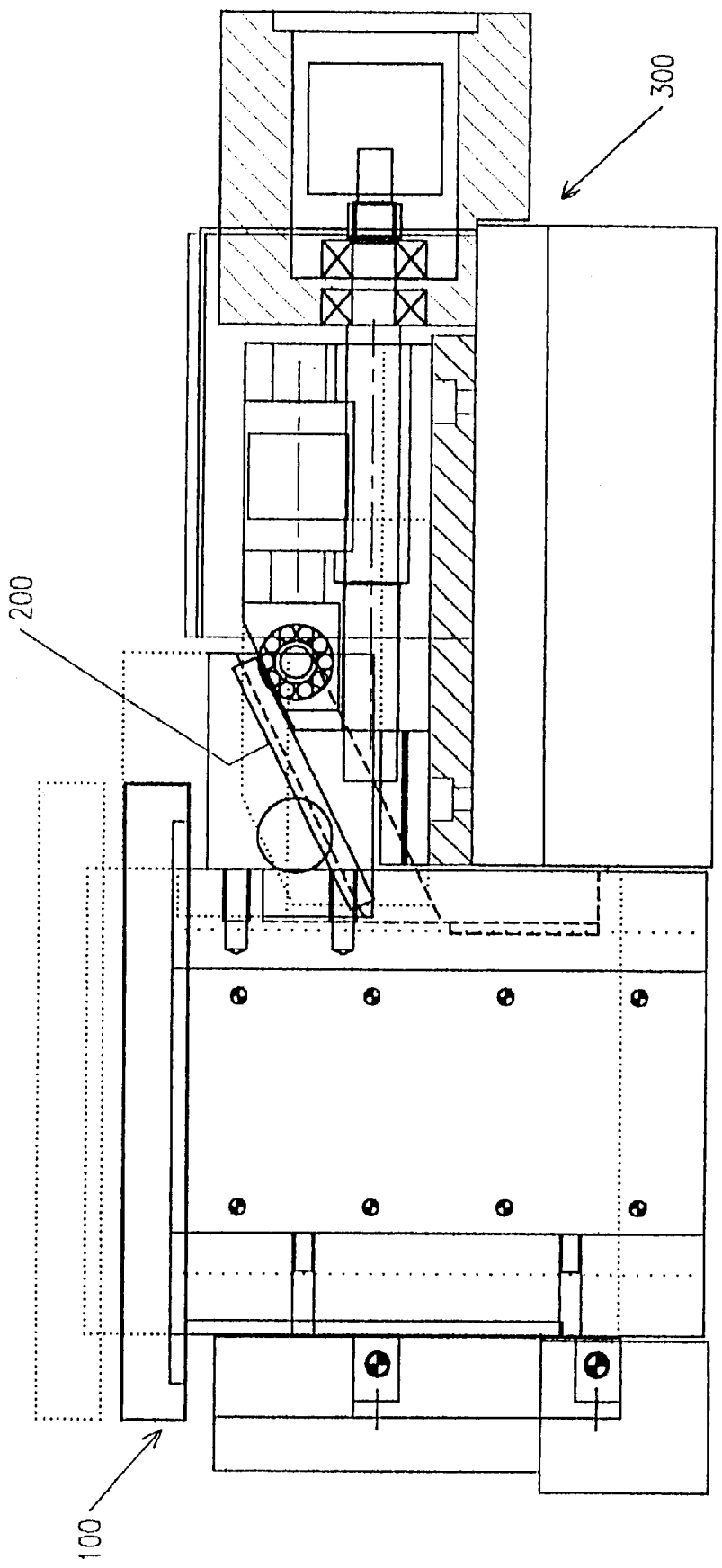
FIG. 4 is a side elevation view of the precision workpiece positioning device of FIG. 1.

The precision workpiece positioning device of the present invention may also be referred to as a "Z" axis positioning device in the positioning industry. "Z" is the axis designation for a vertical coordinate axis, being the third to define a 3-axis spatial coordinate system; the other two axis being the X axis and the Y axis.

In operation, the precision workpiece positioning device is designed to transport a workpiece vertically up and down in the direction of the Z-axis. In accordance with the present invention, the precision workpiece positioning device is capable of transporting workpieces in a predetermined range of travel with great precision and very high resolution.

Referring now in specific detail to the drawings in which like reference numerals identify similar or identical elements throughout the several views, and initially to FIGS. 1–4, an embodiment of a precision workpiece positioning device constructed in accordance with the present disclosure is shown generally as workpiece positioning device 50. As will be discussed in further detail below, workpiece positioning device 50 generally includes an elevator assembly 100, an inclined plane assembly 200 and a drive assembly 300. Elevator assembly 100, inclined plane assembly 200 and drive assembly 300 are typically combined as a single unit and mounted on a frame or base plate 52. Base plate 52 provides structural support for elevator assembly 100 and drive assembly 300. Inclined plane assembly 200 is mounted directly to elevator assembly 100 and does not directly contact base plate 52.

Figure 5:
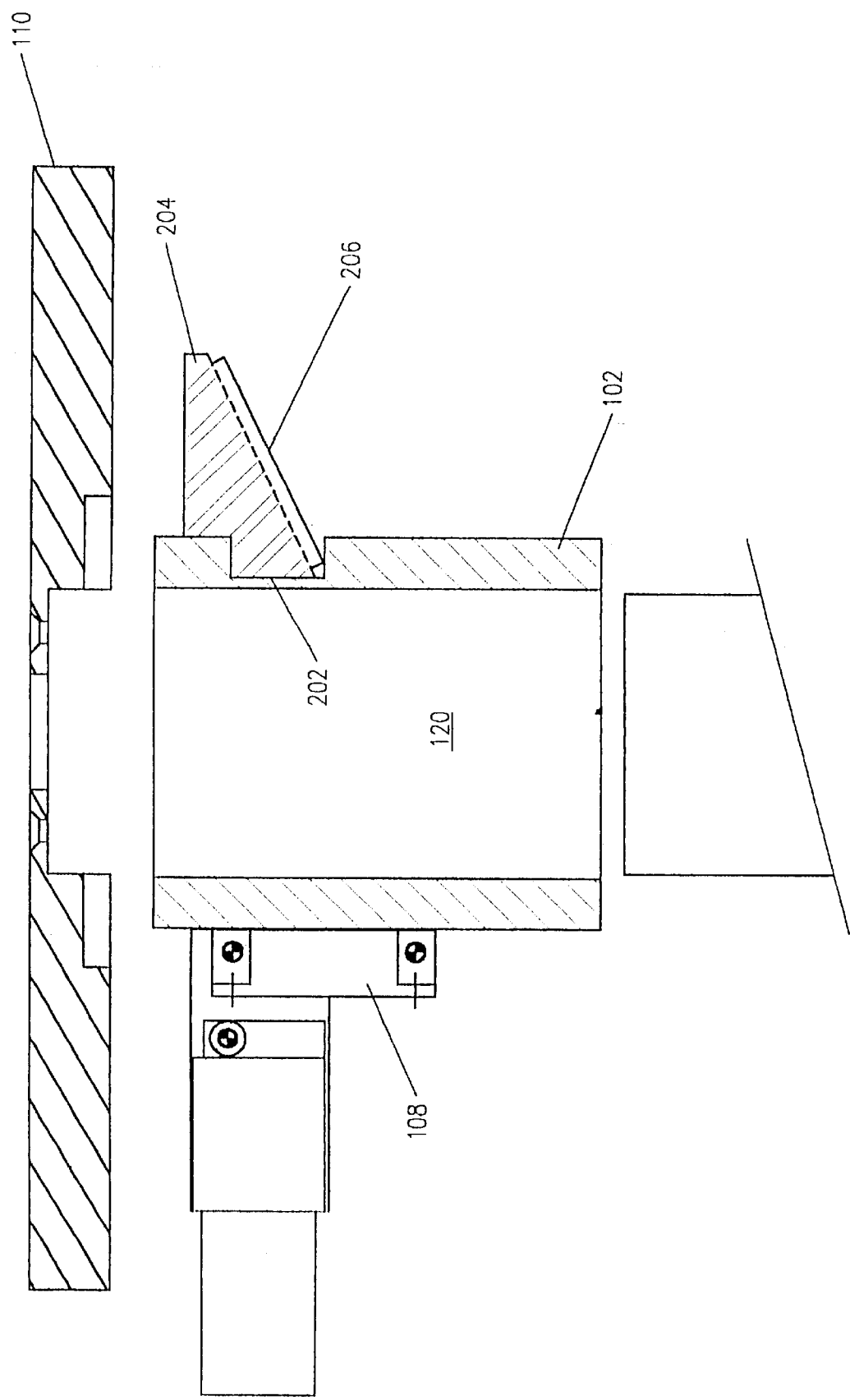
FIG. 5 is a side view of an embodiment of an elevator assembly in accordance with the present invention.

Referring now to FIGS. 5–7, elevator assembly 100, also referred to as the vertical moving part, includes an elevator 102, a pair of rail blocks 104, two pairs of cross roller rail sets 106, a z-axis encoder 108 and a platform 110. An elevator lock 112 may be installed to prevent movement of elevator 102 (e.g., during shipping). Elevator 102 is a monobloc structure and is guided vertically in massive cross roller guides 106 located on either side thereof. The massive cross roller type guides 106 provide a near frictionless linear guide with high stiffness, thus enabling elevator assembly 100 to carry workpieces up to 50 lbs (approximately 25 kg) on platform 110. The rigid monobloc structure of elevator 102 provides a stable structural platform of great precision upon which platform 110 may be mounted. The stroke length of elevator 102 is in the range of zero to about 20 millimeters, and is preferably in the range of about 12 millimeters to about 16 millimeters.

Position encoding devices, such as z-axis encoder 108, provide feedback to a motion controller (not shown) so that the motion controller knows where elevator assembly 100 is located along the Z-axis at any given time of the motion process. Z-axis encoder 108 is preferably a linear glass scale encoder and is mounted on elevator assembly 100 to provide direct position feedback of the vertical travel. It is also contemplated that a second position feedback system may be utilized with the present invention. That is, a rotary encoder may be installed on a servo motor (which is used to drive the drive assembly) to indirectly provide location information of elevator assembly 100 by converting the rotational motion of the servo motor into a linear measurement.

The position feedback system utilized in the present invention exhibits a high resolution. The mechanical advantage (e.g., gearing ratio) of the drive assembly 300 allows approximately a twenty (20) nanometer movement per one (1) encoder pulse when utilizing the rotary encoder. A ten (10) nanometer movement can be detected when utilizing the direct reading linear encoder 108 on elevator assembly 100. With such high resolution, ten (10) nanometer movements of the workpiece can be commanded.

As best seen in FIG. 5, elevator 102 defines a longitudinal bore 120 therethrough. This is referred to as an open frame design. An advantage of an open frame design is that the positioning device may be modified by, for example, positioning a motor within bore 120 to facilitate rotational movement of platform 110.

Also as shown in FIG. 5, inclined plane assembly 200 is fitted within a notch 202 formed in a side portion of elevator 102. Thus, inclined plane assembly 200 is preferably connected to elevator 102 by an interference fit. However, it is also contemplated that inclined plane assembly 200 may be secured within notch 202 by epoxy, welding or any other attachment means known to one having ordinary skill in the art. Inclined plane assembly 200 generally includes two components: a wedge 204 and a strike plate 206. Strike plate 206 is preferably secured to wedge 204 by a pair of plate clamps 208 but may also be secured by epoxy, welding or any other attachment means known to one having ordinary skill in the art. Strike plate 206 is preferably formed of solid tungsten carbide and is machined to a very fine precision surface finish thereby allowing near frictionless motion between the drive assembly 300 and the inclined plane assembly 200, and providing a surface free of deformation.

Figure 8:
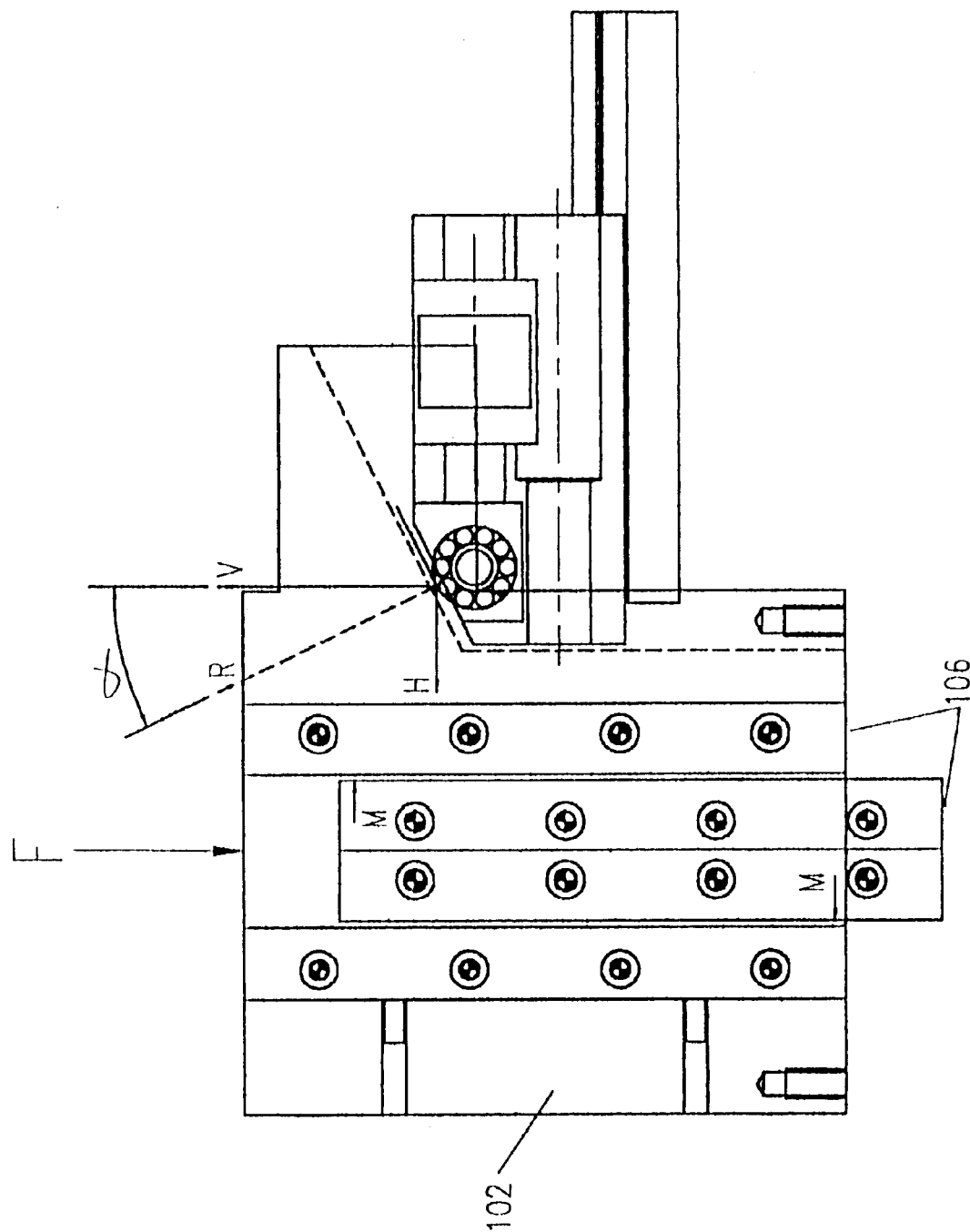
FIG. 8 is a partial side view of an embodiment of the precision workpiece positioning device illustrating a preferred angle of the inclined plane assembly.

Inclined plane assembly 200 is a sub-component of the workpiece positioning device and is capable of being configured with different wedge angles to suit the particular application and needs of the user. In a preferred embodiment, as shown in FIG. 8, the angle $\alpha$ is equal to 26 degrees. As discussed in detail below, when $\alpha$ equals 26 degrees, the magnitude of the vertical component of the force F exerted on inclined plane assembly 200 is greater than two times the magnitude of the horizontal component of the force F. Thus, the effect on elevator assembly 100 is that more of the force F is directed in the vertical direction and less stress is placed on guides 106. It is also contemplated that changes in the magnitude of angle $\alpha$ may be made to allow for different mechanical ratios, thereby resulting in higher speeds or higher resolutions of movement of elevator assembly 100.

The 26 degree angle is chosen as the preferred embodiment because 26 degrees represents the closest integer degree whereby the tangent does not equal or exceed 0.5. This is a key element in this design because, when $\alpha$ equals 26 degrees, the horizontal (axial) component H of the reaction force F is the minority component (less than half) of the resultant force vector R. It is advantageous to have the axial component H as the minority component because as the magnitude of the axial component H approaches the magnitude of the vertical component V an unfavorable condition develops. That is, an offset moment produces a condition where the extreme top and bottom of the guides 106 support the entire load of the system, as indicated by arrows M. This edge-loaded condition is detrimental to a high precision system, where deflections (in the magnitude of micrometers or nanometers) in the guide components are critical to the overall performance.

The 26 degree angle design ensures that the majority of the force vector components will be directed along the vertical plane. This condition minimizes the edge loading effects while maximizing the ease of travel of elevator assembly 100 in the vertical direction.

Figure 9:
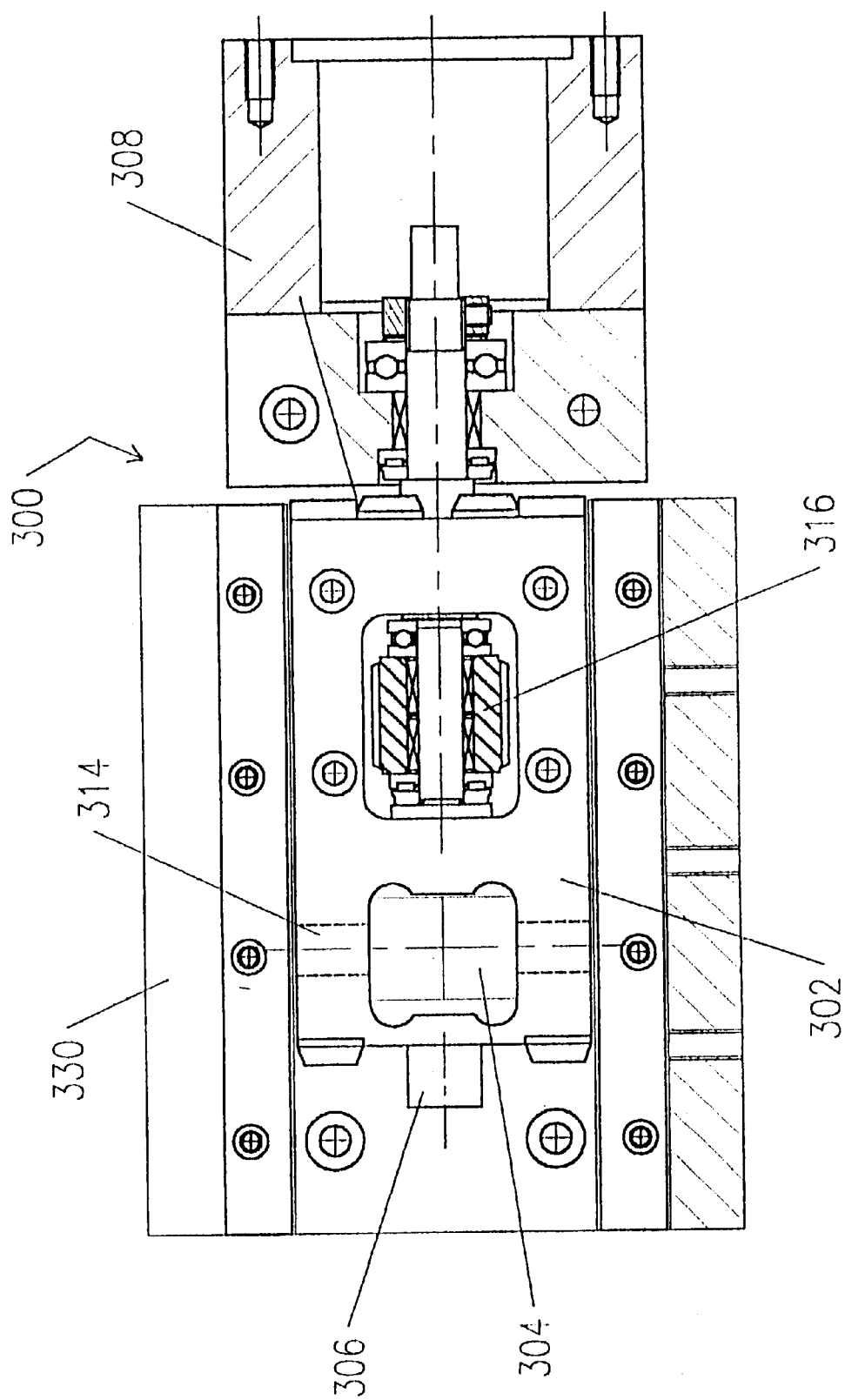
FIG. 9 is a top view in cross-section illustrating a drive assembly and motor extension module in accordance with the present invention.
Figure 10:
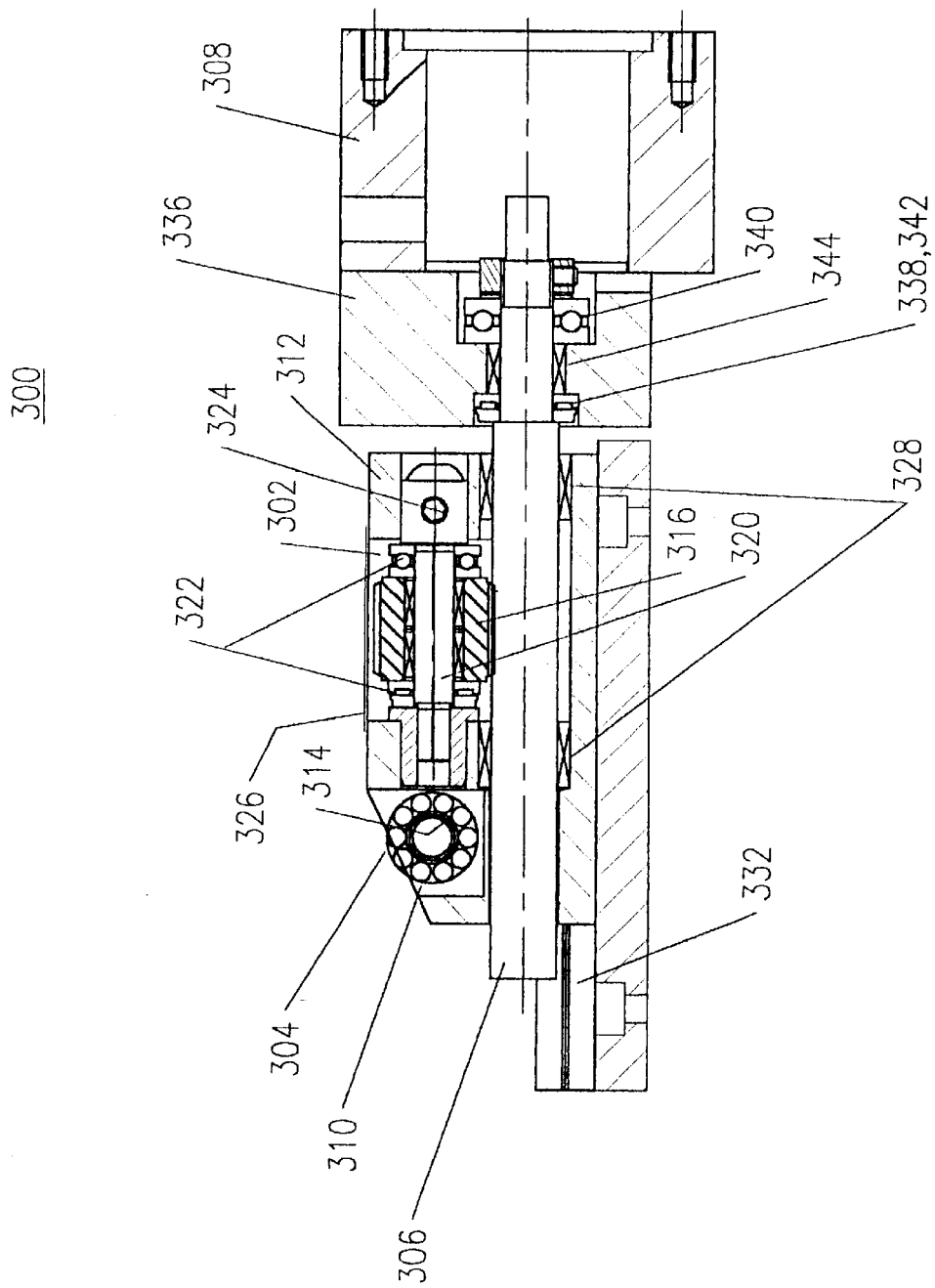
FIG. 10 is a side view in cross-section illustrating a drive assembly and motor extension module in accordance with the present invention.

Referring now to FIGS. 9 and 10, drive assembly 300 is the module which provides the force on the inclined plane assembly 200 to ultimately move elevator assembly 100. Drive assembly 300 generally includes a horizontal slide member 302, a wedge bearing 304, a leadscrew 306 and a motor mount assembly 308. Horizontal slide member 302 includes a first end portion 310 formed in the shape of a wedge, and a second end portion 312.

Wedge bearing 304 is positioned in the first end portion 310 of slide member 302 and rotates about axle pin 314. Axle pin 314 and wedge bearing 304 are positioned such that a portion of the circumference of wedge bearing 304 extends beyond the edge of the inclined surface which forms the wedge shape of first end portion 310. Thus, the portion of the circumference of wedge bearing 304 which extends beyond the edge of the inclined surface becomes the single point of contact between strike plate 206 and slide member 302 as slide member 302 is driven in the direction of elevator assembly 100. Wedge bearing 304 is preferably formed by a set of two needle bearings on a hardened high precision axle pin 314. This combination provides a rigid rolling motion mechanism with very low friction and high stiffness, without any effect of elastic deformation. This contributes to the overall design which allows elevator assembly 100 to support and position a relatively heavy workpiece without affecting the dynamic behavior of the workpiece positioning device.

Slide member 302 includes an integral roller leadscrew 306 for moving slide member 302 back and forth along a horizontal plane toward and away from elevator assembly 100. Leadscrew 306 is supported by a pair of shaft bearings 328. As leadscrew 306 rotates, driven by a servo motor (not shown), the threads of the leadscrew 306 engage the outer circumference grooves of roll 316 which forces slide member 302 to travel along the helix of leadscrew 306. Accordingly, slide member 302 moves back and forth, thereby lifting or lowering elevator assembly 100 when wedge bearing 304 contacts and rolls up and down the inclined plane surface of strike plate 206. Slide member 302 is guided on base 330 via a pair of horizontal cross roller guides 332. It is contemplated that leadscrews having different pitches may be used to change the dynamic behavior of the workpiece positioning device in accordance with the user's requirements.

Roll 316 is supported by a pair of needle bearings 318 which are mounted on an eccentric shaft 320 housed within slide member 302. Thrust bearings 322 are positioned on either end of roll 316. Needle bearings 318 and thrust bearings 322 take up the axial and radial forces in order to achieve a complete freedom from play. Eccentric shaft 320 is kept from rotating by means of a set screw 324. A cover 326 is placed over the top of the opening to the compartment which houses roll 316, shaft 320 and the associated bearings.

A motor mount assembly 308 is installed adjacent second end portion 312 of slide member 302 to facilitate connection of a motor to leadscrew 306. Motor mount assembly 308 includes a thrust block 336; inner and outer thrust bearings 338 and 340, respectively; a thrust plate 342; and a radial bearing 344. Opening 346, defined by motor mount assembly 308, is preferably dimensioned and configured for a NEMA size 23 motor mount. However, it is contemplated that motor mount assembly 308 may be configured to accommodate different size motors.

Although the individual components (i.e., elevator assembly 100, inclined plane assembly 200 and drive assembly 300) may be constructed as a single unit, it is preferred that the three assemblies are constructed as individual modules which may be removably attached to each other. The modularity concept permits replacement of the any one of the three modules independent of the others. For example, drive assembly 300 may be replaced with another drive assembly to alter the dynamics of the workpiece positioning device without disturbing the other two modules. Also, different motor mounts may be employed to facilitate mounting differing sizes and types of motors.

Although the illustrative embodiments of the present invention have been described herein with reference to the accompanying drawings and specifications, it is to be understood that the invention is not limited to those precise embodiments, and that various other changes and modifications may be affected therein by one having ordinary skill in the art without departing from the scope or spirit of the invention. All such changes and modifications are intended to be included within the scope of the invention.

What is claimed is:

1. A workpiece positioning device comprising:
    a frame;
    an elevator assembly mounted on said frame for motion along a z-axis;
    an inclined plane assembly attached to said elevator assembly; and
    a drive assembly mounted on said frame and configured to cause said elevator assembly to move along the z-axis, said drive assembly including a slide member and a bearing positioned in a first end portion of said slide member to contact said inclined plane assembly.

2. The workpiece positioning device as recited in claim 1 wherein said drive assembly further includes a leadscrew for driving said slide member toward and away from said inclined plane assembly.

3. The workpiece positioning device as recited in claim 1 wherein said first end portion of said slide member is formed in the shape of a wedge.

4. The workpiece positioning device as recited in claim 1 wherein said bearing is positioned in said first end portion of said slide member such that a portion of a circumference of said bearing protrudes from a surface of said first end portion of the slide member such that said bearing contacts said inclined plane assembly to cause said elevator assembly to move along a z-axis as said slide member is driven toward and away from said inclined plane assembly.

5. The workpiece positioning device as recited in claim 1 wherein said bearing is a needle bearing.

6. The workpiece positioning device as recited in claim 1 wherein said elevator assembly includes a platform for supporting a workpiece.

7. The workpiece positioning device as recited in claim 1 wherein said elevator assembly includes at least one set of guides positioned on either side of said elevator assembly for maintaining said elevator assembly in alignment with said z-axis.

8. The workpiece positioning device as recited in claim 7 wherein said at least one set of guides is at least one set of cross roller rails.

9. The workpiece positioning device as recited in claim 1 further comprising an encoder mounted adjacent to said elevator assembly for measuring a displacement of said elevator assembly along said z-axis.

10. The workpiece positioning device as recited in claim 1 wherein a stroke of motion of said elevator assembly along the z-axis is in the range of about 12 millimeters to about 16 millimeters.

11. The workpiece positioning device as recited in claim 1 wherein an angle formed between said inclined plane assembly and said frame is 26 degrees.

12. The workpiece positioning device as recited in claim 1 further comprising a motor mount assembly connected to said drive assembly.

13. The workpiece positioning device as recited in claim 1 wherein said drive assembly, said inclined plane assembly and said elevator assembly are configured to cause displacement of a workpiece in increments of about ten nanometers.

14. A workpiece positioning device comprising:
a frame;
an elevator assembly mounted for vertical motion on said frame;
an inclined plane assembly attached to said elevator assembly; and
a drive assembly mounted on said frame and configured to cause said elevator assembly to move in a vertical direction via a single point of contact between said inclined plane assembly and said drive assembly.

15. The workpiece positioning device as recited in claim 14 wherein said drive assembly includes a slide member and a bearing positioned in a first end portion of said slide member, wherein said single point of contact is formed at a point of contact between a circumference of said bearing and a surface of said inclined plane assembly.

16. The workpiece positioning device as recited in claim 14 wherein an angle formed between said inclined plane assembly and said frame is 26 degrees.

17. The workpiece positioning device as recited in claim 14 wherein said drive assembly, said inclined plane assembly and said elevator assembly are configured to cause displacement of a workpiece in increments of about ten nanometers.

18. A method of positioning a workpiece comprising the steps of:
mounting an elevator assembly on a frame;
supporting a workpiece on a platform on said elevator assembly;
attaching an inclined plane assembly to said elevator assembly; and
driving a drive assembly toward and away from said elevator assembly to cause said elevator assembly to move a desired distance along a z-axis via a single point of contact between said drive assembly and said inclined plane assembly.

19. The method of positioning a workpiece as recited in claim 18 further comprising the step of measuring the displacement of said elevator assembly along the z-axis via an encoder mounted on said elevator assembly.

20. The method of positioning a workpiece as recited in claim 18 wherein the driving step comprises driving the elevator assembly along the z-axis in increments of about ten nanometers.

* * * * *